United States Patent [19]
Kerth et al.

[11] Patent Number: 5,172,115
[45] Date of Patent: Dec. 15, 1992

[54] RATIOMETRIC A/D CONVERTER WITH NON-RATIONOMETRIC ERROR OFFSET

[75] Inventors: Donald A. Kerth; Douglas S. Piasecki, both of Austin, Tex.

[73] Assignee: Crystal Semiconductor Corporation, Austin, Tex.

[21] Appl. No.: 717,981

[22] Filed: Jun. 21, 1991

Related U.S. Application Data

[63] Continuation-in-part of Ser. No. 656,294, Feb. 15, 1991.

[51] Int. Cl.⁵ .............................................. H03M 1/06
[52] U.S. Cl. .................................... 341/118; 341/120
[58] Field of Search ............... 341/118, 119, 120, 121, 341/155, 156, 157, 164

[56] References Cited

U.S. PATENT DOCUMENTS

| | | | |
|---|---|---|---|
| 4,063,236 | 12/1977 | Amemiya et al. | 341/118 |
| 4,243,975 | 1/1981 | Masuda et al. | 341/118 |
| 4,943,807 | 7/1990 | Early et al. | 341/120 |

Primary Examiner—A. D. Pellinen
Assistant Examiner—B. K. Young
Attorney, Agent, or Firm—Ross, Howison, Clapp & Korn

[57] ABSTRACT

A ratiometric converter is provided that is comprised of a dual converter system utilizing a first converter (36) and a second converter (38). The second converter (38) is operable to receive the input voltage from a load cell (10) on sense lines (12) and (14) and compare them with an internal reference. Similarly, the first A/D converter (36) is operable to receive the reference voltage to the load cell (10) and compare it with the internal reference. The output of each of the converters (36) and (38) is then input to subtraction circuits (78) and (84), respectively, in the digital domain. In a calibration mode, switches (72) and (73) shorts the reference nodes in the load cell (10) together to determine the non-ratiometric offsets. These offsets are then stored in registers (80) and (86) for the reference voltage and the input voltage, respectively. During operation, the offsets are then input to the subtraction blocks (78) and 84) and a digital subtraction performed on the output of both converters (36) and (38). The output of the subtraction blocks (78) and (84) are then input to a ratiometric operator block (52) to perform a digital division thereon. This results in a ratiometric output that has the non-ratiometric offsets removed. Thereafter, the signal is input to a system calibration block (32) to remove ratiometric errors.

29 Claims, 4 Drawing Sheets

RATIOMETRIC A/D CONVERTER WITH NON-RATIONOMETRIC ERROR OFFSET

CROSS REFERENCE TO RELATED APPLICATIONS

This application is a continuation-in-part of U.S. Pat. application Ser. No. 07/656,294, filed Feb. 15, 1991, and entitled METHOD AND APPARATUS FOR DECREASING INTERFERENCE AND NOISE SENSITIVITY OF A RATIOMETRIC CONVERTER TYPE OF CIRCUIT.

TECHNICAL FIELD OF THE INVENTION

The present invention pertains in general to ratiometric converters and, more particularly, to a ratiometric converter utilizing delta-sigma converters and for offsetting non-ratiometric errors present in the converter.

BACKGROUND OF THE INVENTION

A ratiometric converter is a converter whose output is inversely proportional to its reference voltage and directly proportional to its input voltage. That is:

$$V_{OUT} = k \frac{V_{ain}}{V_{Ref}} ; k \text{ a constant} \tag{1}$$

Many transducer systems use the ratiometric converters to remove the drift and low frequency noise typically seen in the system's reference voltage. A typical transducer system includes a load cell that is powered by the reference voltage. The voltage difference developed across the load cell is proportional to the reference voltage multiplied by the forces applied to the transducer. This is input to the differential inputs of a ratiometric converter wherein the output is then inversely proportional to the reference that powers the load cell and also proportional to the output voltage of the transducer. By utilizing a ratiometric converter, the output does not depend on the system's reference voltage.

As a practical consequence, offsets that do not depend on the reference voltage, i.e., non-ratiometric, exist in the reference input to the ratiometric converter and also in the analog input sense lines. These offsets can be external or internal to the converter. Thermal emfs (thermocouples), charge injection and RF interference are some offset mechanisms. These offsets can introduce an error in the output that is dependent on the reference voltage. The measurement, therefore, is no longer ratiometric due to the presence of these non-ratiometric offsets, i.e., since they are independent of the reference voltage.

Present systems typically utilize AC excitation to remove external non-ratiometric offsets. In an AC excitation system, the system reference voltage is modulated, which in turn modulates the transducers output. Any non-ratiometric offsets that may exist in the reference voltage and in the input voltage sense lines are not modulated. Therefore, offsets that exist before the demodulation portion of the system are modulated up in frequency when the input and reference voltage signals are demodulated back down. These modulated offsets are removed by post-filtering. Any offsets that exist after the demodulation portion may still corrupt the ratiometric measurement. For low resolution systems, these offsets are insignificant because their effect is divided down by the instrumentation amplifier gain in the front end of the system. For high resolution systems, however, these offsets may still present a problem.

Another type of architecture, the "double pump" excitation architecture, provides a method for minimizing non-ratiometric offset effects. In this topology, the ratiometric digital output is a linear combination of two measurements; one for the reference voltage at half scale and the other for the reference voltage at full scale. This is analogous to an auto-zero scheme. The double-pumped architecture assumes that the two reference voltages are perfectly ratioed for cancellation of the non-ratiometric offsets. For example, if the ratio of half scale to full scale reference voltage is in error by one percent, then one percent of the non-ratiometric offsets is not canceled. Therefore, the double-pumped system still may have non-ratiometric offset errors that exist in the system.

SUMMARY OF THE INVENTION

The present invention, disclosed and claimed herein, comprises a ratiometric converter with non-ratiometric offset correction. The converter is comprised of an analog-to-digital converter that is operable to receive an input reference signal and an input sense signal and perform a ratiometric operation thereon and provide an output signal proportional to the input sense signal and inversely proportional to the input reference signal. A storage device is provided for storing a non-ratiometric offset value. This value is subtracted prior to the ratiometric operation in the analog-to-digital converter to remove the offset value therefrom.

In a further aspect of the present invention, a system calibration is provided on the output of the analog-to-digital converter for removing ratiometric offsets and gain errors after correction for non-ratiometric offsets. Further, a non-ratiometric offset device is provided for determining the non-ratiometric offsets that actually exist in the analog-to-digital converter for storage in the storage device.

In yet another aspect of the present invention, the non-ratiometric offset device is operable to, in a first mode, determine the offset for each value that is processed through the analog-to-digital converter and, after determining the offset, subtracting the offset therefrom. In the second mode, the non-ratiometric offset device is operable to determine the non-ratiometric offset value in a separate calibration operation for storage in the offset register. Thereafter, for each input value processed by the analog-to-digital converter, the offset value is subtracted therefrom.

In another aspect of the present invention, the analog-to-digital converter is comprised of a dual converter system utilizing a first analog-to-digital converter for receiving the input reference signal and outputting a digital reference signal and a second analog-to-digital converter for receiving the input sense signal and outputting a digital sense signal. Both the first and second analog-to-digital converters are compared to an internal reference that is separate from the input reference signal. A divider circuit is provided for performing the ratiometric operation on the digital sense signal and the digital reference signal in the digital domain. The subtraction circuit is operable to remove the non-ratiometric offsets from the digital reference signal and the digital sense signal prior to being operated upon by the divider circuit.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
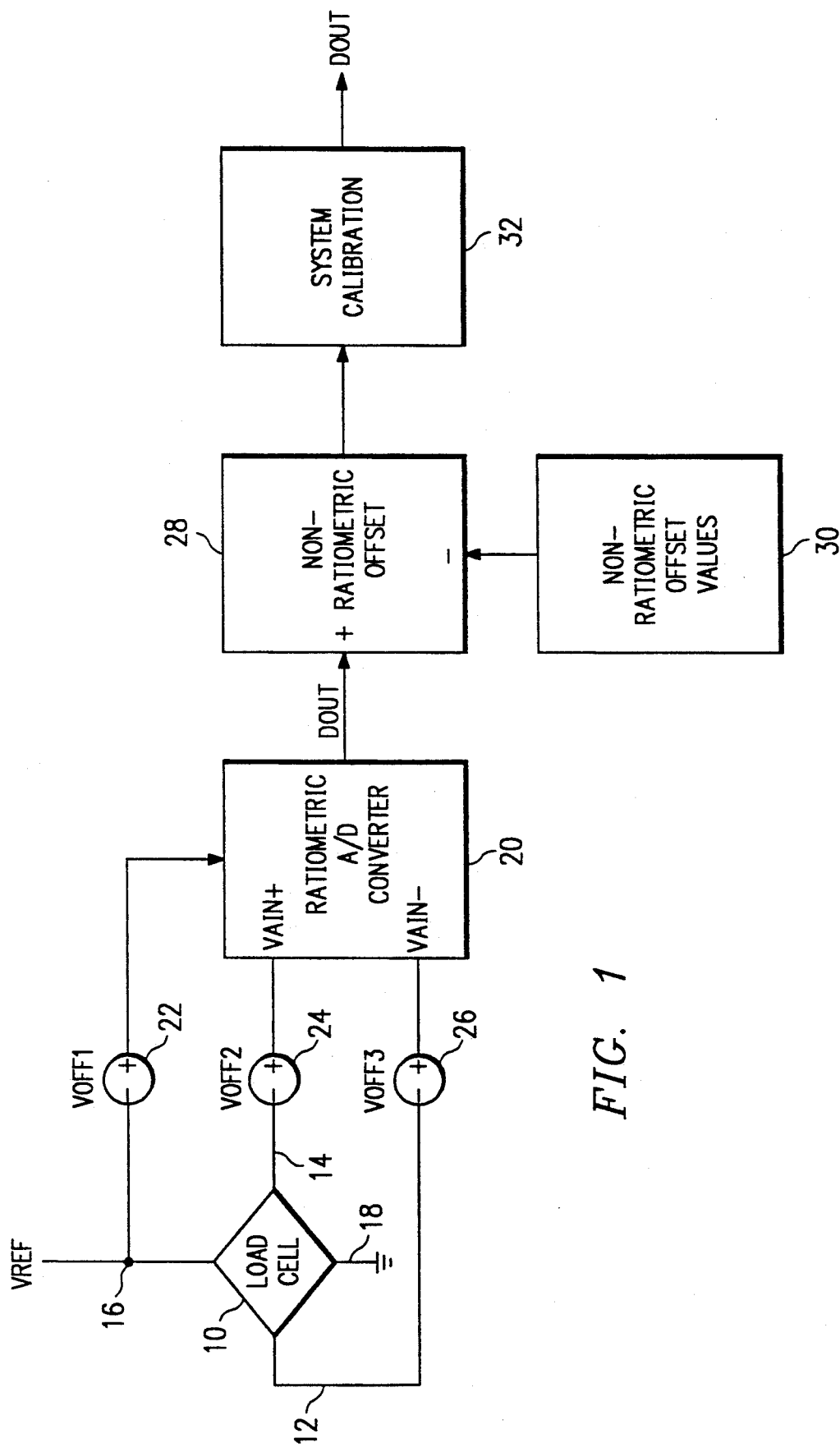
FIG. 1 illustrates an overall block diagram of the ratiometric A/D converter utilizing a non-ratiometric offset correction block and also for providing an overall system calibration.

Referring now to FIG. 1, there is illustrated a block diagram of a ratiometric converter with non-ratiometric offset correction. A load cell 10 is illustrated that has a first output sense line 12 and a second output sense line 14. Additionally, a reference voltage is provided to power the load cell 10 on a line 16, the other side of the load cell 10 connected to ground through a line 18. The load cell 10 is any type of transducer that is utilized in systems such as DC measurement and control systems, which transducer will have an output voltage that is proportional to some applied force or temperature and is also proportional to the reference voltage $V_{REF}$.

The sense lines 12 and 14 are input to a ratiometric analog-to-digital (A/D) converter 20, in addition to the reference voltage $V_{REF}$ on line 16. The ratiometric converter 20 is operable to produce a ratiometric output that is proportional to its analog input and inversely proportional to its reference voltage. Therefore, the overall system would be insensitive to any variations in the reference voltage $V_{REF}$. However, non-ratiometric offsets in the sense lines 12 and 14, and also in the reference voltage lines 16, are illustrated by offset blocks 22, 24 and 26. Offset block 22 is disposed in series between the reference voltage on line 16 and the ratiometric converter 20 and the offset blocks 24 and 26 are disposed in series with the sense lines 14 and 12, respectively, on the inputs to the ratiometric converter 20.

The ratiometric A/D converter 20 is operable to provide a digital output which is input to a non-ratiometric error offset block 28 on the positive input thereof. Offset values that are stored in a storage device 30 are input to the negative input of the ratiometric offset block 28. The offset values are utilized to offset the error from the digital output of the ratiometric A/D converter 20 to output a value that is error free relative to non-ratiometric offsets. This value is then input to a system calibration block 32 for calibrating the system. The system calibration block is described in U.S. Pat. No. 4,943,807, titled "Digitally Calibrated Delta-Sigma Analog-to-Digital Converter", issued to Early, et al, and assigned to the present Assignee, which patent is incorporated herein by reference.

In operation, the system calibration block 32 is only operable to calibrate for gain errors and ratiometric offsets. The non-ratiometric offsets cannot be calibrated for in this system calibration block. Therefore, the non-ratiometric offset values are first determined and then stored in the storage device 30. Thereafter, these values are subtracted from the digital output of the A/D converter 20, prior to compensating for the system gain and ratiometric offsets.

As will be described hereinbelow, the non-ratiometric offset values are determined after the conversion from the analog domain to the digital domain and then the offset correction accomplished in one of two ways. In a first method, the offset value representing the non-ratiometric error is determined for each word and then the digital value of this word corrected by this offset value on a word-by-word basis. In the second method, the system is calibrated by determining the offset value in a calibration procedure, storing this value in a register and thereafter subtracting the stored offset value. Of course, in the second method, the system must be periodically recalibrated for non-ratiometric offsets as a result of drift, temperature variations, etc. in the system.

Figure 2:
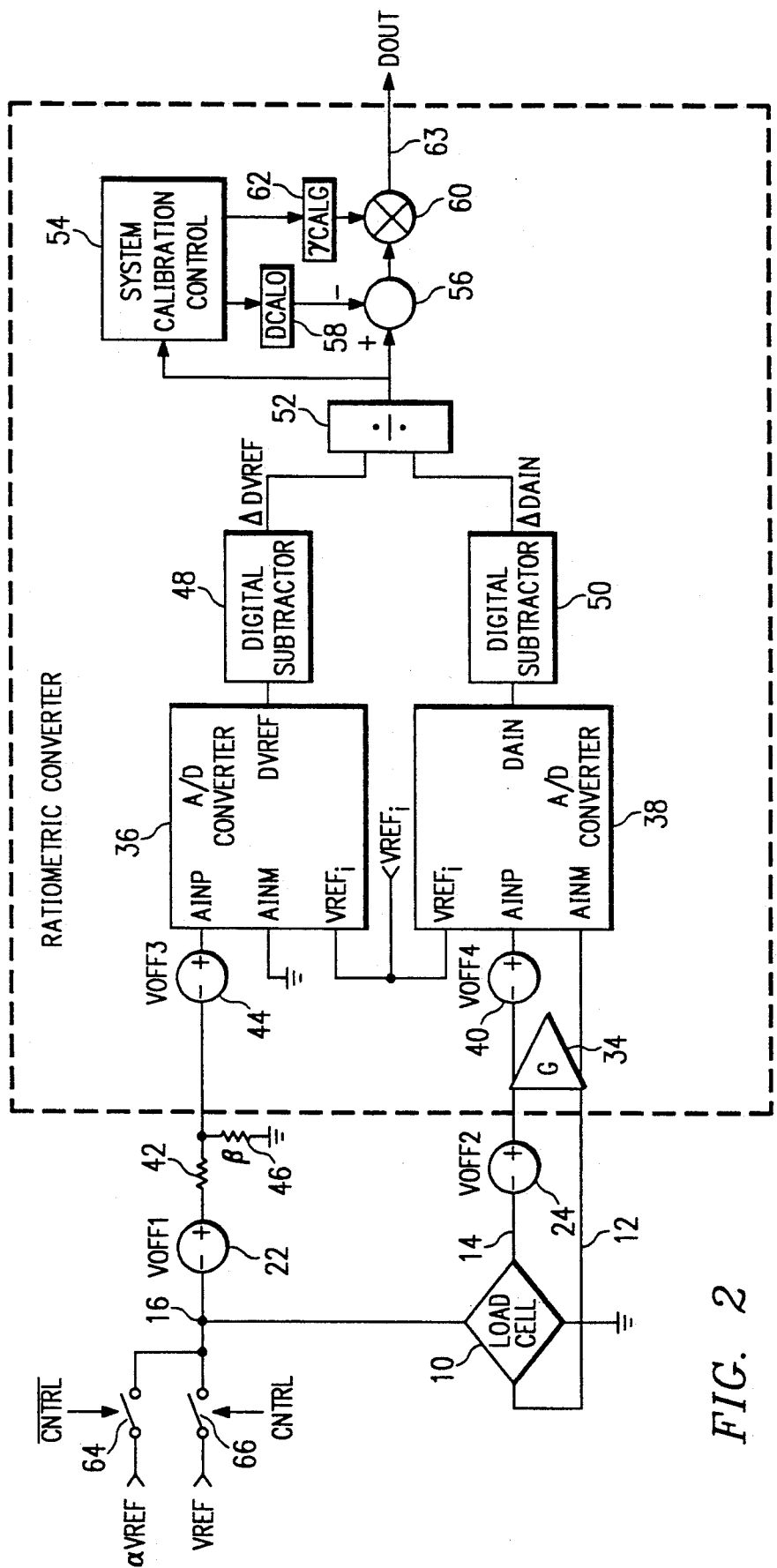
FIG. 2 illustrates an overall block diagram of the ratiometric converter with non-ratiometric offset correction.

Referring now to FIG. 2, there is illustrated a detailed block diagram of a ratiometric converter with non-ratiometric offset correction. The sense line 14 is input to one input of an instrumentation amplifier 34 having a gain "G" with only the offset error 24 being illustrated and labelled $V_{OFF2}$. The error block 26 is not illustrated for simplicity purposes. Two A/D converters 36 and 38 are provided that comprise part of a "dual converter", which is a digitally ratioed converter that is described in U.S. patent application Ser. No. 07/656,294, filed Feb. 15, 1991, and entitled "Method and Apparatus for Decreasing the Interference and Noise Sensitivity of a Ratiometric Converter Type of Circuit", which disclosure is incorporated herein by reference. This type of converter digitizes the reference and transducer sense signals separately, and is substantially immune to interference that may couple into its inputs. In the preferred embodiment, the A/D converters 36 and 38 that comprise a major portion of the dual converter comprise delta-sigma modulator based converters.

The differential outputs of the instrumentation amplifier 34 are input to the two inputs $A_{INP}$ and $A_{INM}$ of A/D converter 38. The input $A_{INP}$ goes through an offset block 40, having the offset voltage $V_{OFF4}$. The line 16, having the reference voltage disposed thereon and the error block 22 associated therewith with the voltage $V_{OFF1}$ disposed thereon, is input to one side of a resistor 42, with the other side thereof connected through an error block 44 with voltage $V_{OFF3}$ to the positive input $A_{INP}$, of the A/D converter 36. The other side of the resistor 42 is also connected to ground through a resistor 46; resistors 42 and 46 provide a resistive dividing network. The minus input, $A_{INM}$, of A/D converter 36 is connected to ground. The $V_{REF}$ inputs of the A/D converters 36 and 38 are both connected to an internal reference voltage $V_{REFI}$, which is different than the reference voltage connected to line 16.

The digital output of A/D converter 36, $D_{VREF}$, is input to a digital subtraction circuit 48 and, similarly, the digital output, $D_{AIN}$, of A/D converter 38 is also input to a digital subtraction circuit 50. The digital subtraction circuits 48 and 50, as will be described hereinbelow, are operable to remove the non-ratiometric offsets during a subtraction operation. The subtraction operation occurs on the word-by-word basis such that the non-ratiometric offset is first determined and then subtracted. The output of the digital subtraction circuit 48, $\Delta D_{VREF}$, is input to a digital ratiometric operation block 52. Similarly, the output of the digital subtraction circuit 50, $\Delta D_{AIN}$, is also input to the digital ratiometric operation block 52. The digital ratiometric operation block operates in accordance with a predetermined algorithm that, when the system is utilized as a ratiometric converter, is a division operation in which the digitized sense signal $\Delta D_{AIN}$ is divided by the digitized reference signal $\Delta D_{VREF}$.

The output of the digital ratiometric operation block 52 is input to a system calibration system control block 54 and also into a subtraction block 56. The system calibration control is operable to determine an output calibration offset value and store this determined value in a register 58, the output of which is input to the subtraction block 56 on the minus input thereof. The output of the subtraction block 56 is input to a multiplication block 60, the other input thereof received from the output of a register 62. Register 62 stores a gain factor $\gamma CALG$, which is also generated by the system calibration control during a calibration process As described above, this calibration process is described in U.S. Pat. No. 4,943,807, which was incorporated herein by reference. The calibrated digital output signal, $D_{OUT}$ is output on a line 63.

The reference voltage on line 16 is connected to one side of two switches 64 and 66. Switches 64 and 66 are controlled by a CNTRL-BAR signal and a CNTRL signal, respectively. The other side of switch 64 is connected to a $\alpha \cdot V_{REF}$ voltage signal and the other side of the switch 66 is connected to the $V_{REF}$ voltage. The $\alpha \cdot V_{REF}$ voltage differs from the $V_{REF}$ voltage by a factor "$\alpha$".

In operation, for the reference voltage at $V_{REF}$, the following relationships for $D_{AIN1}$ and for $D_{VREF1}$ exist:

$$D_{AIN1} = \frac{G_\chi V_{REF} + GV_{OFF2} + V_{OFF4}}{V_{REFi}} \quad (2)$$

where: $\chi$ is the gain of the transducer, which is dimensionless, and $$D_{VREF1} = \frac{\beta V_{REF} + \beta V_{OFF1} + V_{OFF3}}{V_{REFi}} \quad (3)$$

where: $\beta$ is the amount of attenuation of the reference.

Equations 2 and 3 define the first conversion, whereas the second conversion is performed with the reference voltage at $\alpha \cdot V_{REF}$ $\alpha$ can be any number except for "1", with $\alpha=0$ also valid. The second conversion is as follows:

$$D_{AIN2} = \frac{G_\chi \cdot \alpha V_{REF} + GV_{OFF2} + V_{OFF4}}{V_{REFi}} \quad (4)$$

$$D_{VREF2} = \frac{\beta \cdot \alpha V_{REF} + \beta V_{OFF1} + V_{OFF3}}{V_{REFi}} \quad (5)$$

The digital output is the ratio of the difference of the two conversions. Furthermore, system calibration corrects for ratiometric offset and gain errors as follows:

$$D_{OUT} = \left( \frac{\Delta D_{AIN}}{\Delta D_{VREF}} - D_{cal0} \right) \gamma_{calg} \quad (6)$$

$$D_{OUT} = \left( \frac{D_{AIN1} - D_{AIN2}}{D_{VREF1} - D_{VREF2}} - D_{cal0} \right) \gamma_{calg} \quad (7)$$

$$D_{OUT} = \left( \frac{G_\chi}{\beta} - D_{cal0} \right) \gamma_{calg} \quad (8)$$

Note that non-ratiometric offsets ($V_{OFF1}$, $V_{OFF2}$, $V_{OFF3}$, $V_{OFF4}$) are removed from $D_{out}$ irrespective of the actual value of $\alpha$. The non-ratiometric offsets are removed prior to any removal of the ratiometric offsets as a result of the system calibration.

Figure 3:
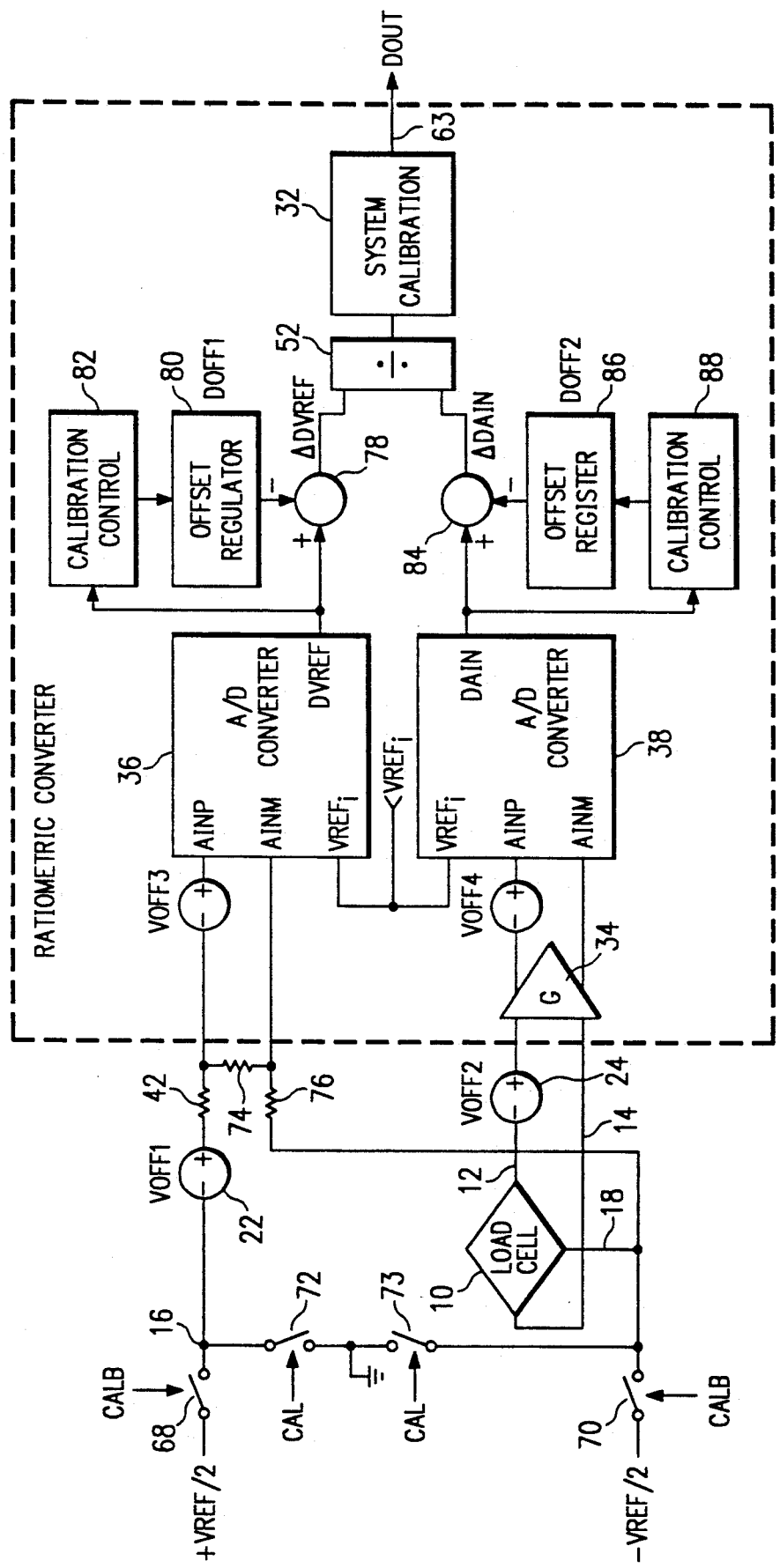
FIG. 3 illustrates a block diagram of a ratiometric converter with non-ratiometric offset calibration.

Referring now to FIG. 3, there is illustrated the preferred embodiment of the present invention utilizing a ratiometric converter with non-ratiometric offset calibration. The circuit is substantially identical to that of FIG. 2 with the exception that the load cell 10 is connected between the line 16 and the line 18, with the line 16 being connected to one side of a switch 68 and the line 18 is not connected to ground but, rather, to one side of a switch 70. The other side of the switch 68 is connected to a voltage $+V_{REF}/2$ and the other side of the switch 70 is connected to a voltage $-V_{REF}/2$. A switch 72 is provided that is connected between line 16 and ground and a switch 73 is provided that is connected between line 18 and ground. The control signal for switches 72 and 73 is a CAL signal and the control signal for the switches 68 and 70 is a CAL-BAR signal, which is the inverse of the CAL signal. The line 16 is connected through the offset block 22 to one side of the resistor 42. The other side of resistor 42 is connected to one side of a resistor 74 and also to $V_{OFF3}$, which is then connected to $A_{INP}$ of converter 36. The other side of resistor 74 is connected to the $A_{INM}$ input of converter 36 and also to one side of a resistor 76. The other side of resistor 76 is connected to the line 18.

The output $D_{VREF}$ of the A/D converter 36 is connected to the positive input of a subtraction block 78. The negative side of the subtraction block is connected to the output of an offset register 80. The offset register 80 is loaded from a calibration control block 82, which receives as one input the output of the converter 36. Similarly, the output $D_{AIN}$ of the A/D converter 38 is input to the positive input of a subtraction block 84, the negative input thereof connected to the output of an offset register 86. The offset register 86 is loaded from a calibration control block 88, the input of the calibration control block 88 being connected to the output of the A/D converter 38. The calibration control blocks 82 and 88 are operable to determine during the calibration cycle the non-ratiometric offset, which is $D_{OFF1}$ for offset register 80 and $D_{OFF2}$ for offset register 86. These offsets can be subtracted from the outputs of the A/D converters 36 and 38 to provide the signals $\Delta D_{VREF}$ and $\Delta D_{AIN}$. These are then input to the ratiometric operator block 52 which, as described above, is a division operation. The output of the block 52 is input to the system calibration block 32, as described above with reference to FIG. 2.

In operation, it is necessary to enter into a calibration step for the ratiometric converter prior to operating the system. During the non-ratiometric offset calibration, the reference voltage is grounded (or shorted) with switches 72 and 73. With the reference voltage grounded, the A/D converters measure the systems offsets, $D_{OFF2}$ and $D_{OFF1}$, which values are stored in the registers 80 and 86. The equations for these are as follows:

$$D_{OFF1} = \frac{\beta V_{OFF1} + V_{OFF3}}{V_{REFi}} \quad (9)$$

$$D_{OFF2} = \frac{G V_{OFF2} + V_{OFF4}}{V_{REFi}} \quad (10)$$

From Equations 9 and 10, it is noticed that if the AC excitation is utilized, the offsets that reside before the demodulation will be removed by filtering. In an AC excitation system, the transducer reference voltage is modulated by signals that control switches connected to the reference voltages, such that the polarity of the load cell is an AC signal. A demodulation block would then be required in the ratiometric converter to translate the AC excited reference voltage to a DC value. This demodulation in turn modulates any non-ratiometric offsets that reside before the demodulation block to an AC signal. These AC excited offsets can then be removed by filtering.

During normal conversions, the stored offsets are subtracted from the digital reference and transducer sense values. The $V_{REF}$ path is processed as follows:

$$\Delta V_{DREF} = D_{VREF} - D_{OFF1} \quad (11)$$

Substituting for $D_{VREF}$ into Equation 11 yields:

$$\Delta D_{VREF} = \frac{\beta(V_{REF} + V_{OFF1}) + V_{OFF3}}{V_{REFi}} - D_{OFF1} \quad (12)$$

Substituting for DOFF1 in Equation 12 yields:

$$\Delta D_{VREF} = \frac{\beta V_{REF}}{V_{REFi}} \quad (13)$$

The analog input path is processed as:

$$\Delta D_{AIN} = D_{AIN} - D_{OFF2} \quad (14)$$

Substituting for $D_{AIN}$ in equation 14 yields:

$$\Delta D_{AIN} = \frac{G(\chi V_{REF} + V_{OFF2}) + V_{OFF4}}{V_{REFi}} - D_{OFF2} \quad (15)$$

Substituting equation 10 into equation 15 yields:

$$\Delta D_{AIN} = \frac{G \chi V_{REF}}{V_{REFi}} \quad (16)$$

$\Delta D_{AIN}$ is digitally divided by $\Delta D_{VREF}$ to provide for a ratiometric output. This ratiometric output is corrected to remove ratiometric offset and gain errors within the system calibration block. The output is given by:

$$D_{OUT} = \left( \frac{\Delta D_{AIN}}{\Delta D_{VREF}} - D_{cal0} \right) \gamma_{calg} \quad (17)$$

$$D_{OUT} = \left( \frac{D_{AIN} - D_{OFF2}}{D_{VREF} - D_{OFF1}} - D_{cal0} \right) \gamma_{calg} \quad (18)$$

$$D_{OUT} = \left( \frac{G \chi V_{REF}/V_{REFi}}{\beta V_{REF}/V_{REFi}} - D_{cal0} \right) \gamma_{calg} \quad (19)$$

$$D_{OUT} = \left( \frac{G \chi V_{REF}}{\beta V_{REF}} - D_{cal0} \right) \gamma_{calg} \quad (20)$$

$$D_{OUT} = \left( \frac{G \chi}{\beta} - D_{cal0} \right) \gamma_{calg} \quad (21)$$

From Equations 17 through 21, it is noticed that all non-ratiometric offsets ($V_{OFF1}$, $V_{OFF2}$, $V_{OFF3}$, $V_{OFF4}$) are removed assuming drift and aging are negligible. Of course, the calibration needs to be performed on a periodic basis to account for such drifts. Therefore, the preferred embodiment achieves a higher throughput than the previous embodiment since only one conversion is required for each output word.

Figure 4:
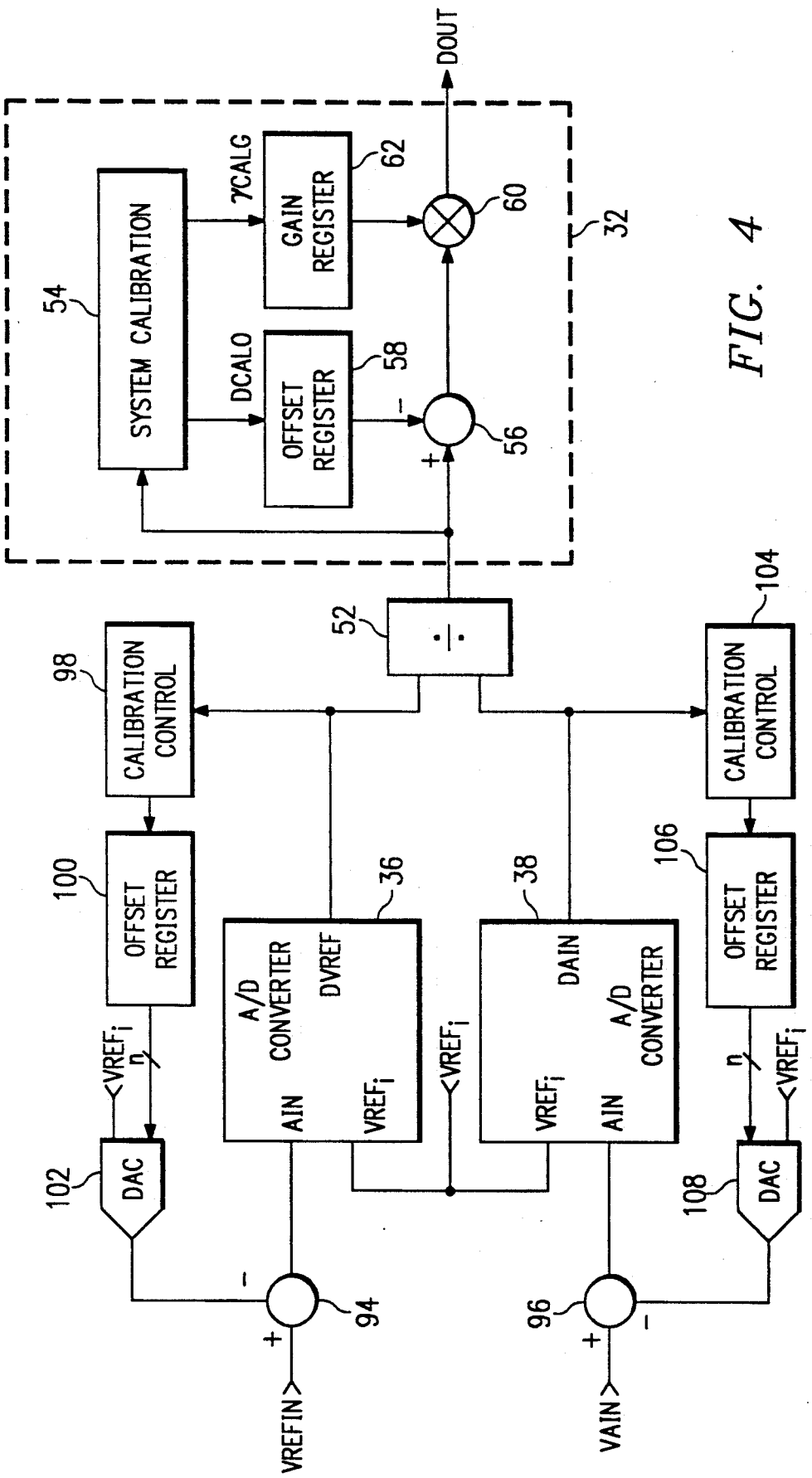
FIG. 4 illustrates a block diagram of a ratiometric converter with analog correction of non-ratiometric offsets.

Referring now to FIG. 4, there is illustrated an alternate embodiment of the present invention utilizing a ratiometric converter with analog correction. The $V_{REF}$ signal that is input to the $A_{INP}$ and $A_{INM}$ inputs of the A/D converter 36 is first input to the positive input of a subtraction block 94, the output of which is input to the $A_{IN}$ input of A/D converter 36. Although illustrated as a single input, it should be understood that two inputs are present, a positive and a minus input. Similarly, the $V_{AIN}$ input from the instrumentation amplifier 34 is input to the positive input of a subtraction block 96, the output of which is input to the $A_{IN}$ input of the A/D converter 38. The $D_{VREF}$ output of A/D converter 36 and the $D_{AIN}$ output of A/D converter 38 are both input to the ratiometric operator block 52 which provides a division operation. The output of block 52 is input to the system calibration block 32.

The $D_{VREF}$ output of A/D converter 36 is input to a calibration control block 98, the output of which generates an offset value for storage in an offset register 100. However, the offset value as stored in register 100 is then input to the digital input of a digital to-analog converter (DAC) 102 to convert the value to an analog value utilizing as a reference to the DAC 102 the reference voltage $V_{REFi}$. DAC 102 has the analog output thereof input to the negative input of subtraction block 94. The calibration control block 98 is a successive approximation routine that provides a control loop to successively drive the output of the D/A converter 102, such that the output of A/D converter 36, $D_{VREF}$, is essentially a zero value. The control word for the D/A converter 102, representing the offset, is stored in register 100. As in the preferred embodiment, the calibration operation is performed with the transducer reference voltage grounded or shorted.

Similarly, the $D_{AIN}$ output of A/D converter 38 is input to a calibration control block 104, similar to calibration control block 98. The control block 104 is operable to generate, during a calibration operation, an offset value for storage in an offset register 106. The offset register 106 is utilized to provide a digital offset value for input to a DAC 108, the analog output of which is input to the negative input of the subtraction block 96. The DAC 108 utilizes as a reference the $V_{REFi}$ reference voltage. In operation, the offset value in register 106 would be determined in substantially the same way as the offset value in register 100.

In summary, there has been provided a ratiometric converter with the capability of removing non-ratiometric offsets that exist within a ratiometric system. The system first determines in the digital domain the non-ratiometric offset values and stores these in a register and then subtracts these offset values, resulting in elimination of the non-ratiometric offsets. In one mode, each word is passed through the system to determine the non-ratiometric offset and then the non-ratiometric offset value generated and subtracted during a second pass such that each word requires two passes. In a second mode, the system is calibrated to determine the non-ratiometric offset value, and this is stored in a register. Subsequent passes through the system are utilized with a subtraction operation resulting in removal of the non-ratiometric offsets. Thereafter, the system is calibrated to remove ratiometric errors.

Although the preferred embodiment has been described in detail, it should be understood that various changes, substitutions and alterations can be made therein without departing from the spirit and scope of the invention as defined by the appended claims.

What is claimed is:

1. A ratiometric converter with non-ratiometric offset correction, comprising:
    an analog-to-digital converter for receiving an input sense signal and an input reference voltage, the sense signal having associated therewith non-ratiometric offsets, said analog-to-digital converter operable to perform a ratiometric operation thereon and provide an output signal proportional to said input sense signal and inversely proportional to said input reference signal in the digital domain;
    a storage device for storing non-ratiometric offset data corresponding to the input non-ratiometric offsets; and
    a correction circuit for changing the operating parameters of said analog-to-digital converter in accordance with said stored non-ratiometric offset data to substantially correct for the non-ratiometric offsets.

2. The converter of claim 1, wherein said stored non-ratiometric offset data comprises the input non-ratiometric offsets and said correction circuit comprises a subtraction circuit for performing a subtraction operation to subtract said stored non-ratiometric offset data during the operation of said analog-to-digital converter prior to the ratiometric operation in said analog-to-digital converter such that the input non-ratiometric offsets are corrected for.

3. The converter of claim 2, and further comprising a system calibration device for correcting gain errors and ratiometric offsets after correction for the input non-ratiometric offsets.

4. The converter of claim 2, and further comprising a non-ratiometric offset device for determining the non-ratiometric offset data for storage in said storage device.

5. The converter of claim 4, wherein said non-ratiometric offset device is operable to determine the input non-ratiometric offsets for each value of the input sense signal having non-ratiometric offsets associated therewith and processed by said analog-to-digital converter such that said subtraction circuit subtracts the non-ratiometric offsets determined for each input value of the input sense signal from the digital domain value thereof.

6. The converter of claim 4, wherein said non-ratiometric offset device is operable to determine said non-ratiometric offset data in a separate calibration operation for storage in said storage device.

7. The converter of claim 4, wherein said analog-to-digital converter comprises:
    a first analog-to-digital converter for receiving said input sense signal and for converting said input sense signal to a digital sense signal based on an internal reference signal;
    a second analog-to-digital converter for receiving said input reference signal and for converting said input reference signal to a digital reference signal based on said internal reference signal; and
    a divider circuit coupled to said first and second analog-to-digital converters for dividing a digital sense signal by said digital reference signal to provide said output signal;
    said subtraction circuit operating in the digital domain and subtracting said stored non-ratiometric offset data in said storage device from said digital sense signal prior to input to said divider circuit.

8. The converter of claim 7, wherein the input non-ratiometric offsets comprise a first non-ratiometric offset value associated with non-ratiometric offsets associated with said input sense signal and further including a second non-ratiometric offset value associated with non-ratiometric offsets in said input reference signal, said storage device comprising:
    a first storage register for storing said first non-ratiometric offset value; and
    a second storage register for storing said second non-ratiometric offset storage value;
    said subtraction circuit including:
        a first subtraction block for receiving the output of said first analog-to-digital converter and the output of said first storage register and subtracting the two values to provide a corrected digital sense signal, and
        a second subtraction block for receiving the output of said second analog-to-digital converter and the output of said second storage register and subtracting the two values to provide a corrected digital reference signal, said corrected digital reference signal and said corrected digital sense signal comprising the inputs to said divider circuit.

9. The converter of claim 8, wherein said non-ratiometric offset device is operable to determine said first and second non-ratiometric offset values for each input sense value processed by said first and second analog-to-digital converters in a first pass through said first and second analog-to-digital converters and subtracting in a second pass of said values through said first and second analog-to-digital converters the determined offset values from the output of said first and second analog-to-digital converters, respectively, to provide the corrected digital reference signal and digital sense signals for input to said divider circuit.

10. The converter of claim 9, wherein said non-ratiometric offset device comprises:
    a reference voltage control for controlling the reference voltage to provide a first preference voltage during said first pass and to provide a second reference voltage during said second pass, said second reference voltage proportional to said first reference voltage by a predetermined proportionality factor; and
    a controller for controlling said subtraction circuit to store the output of said first and second analog-to-digital converters during said first pass, and subtracting the stored values from the output of said analog-to-digital converters during said second pass to provide the corrected digital reference signal and digital sense signal.

11. The converter of claim 8, wherein said non-ratiometric offset device comprises:
   a reference voltage control for controlling the input reference voltage to be at a first and known calibration reference voltage during a calibration cycle and at said input reference voltage signal level during a normal operation mode when not in said calibration mode; and
   a calibration controller for measuring the output of said first and second analog-to-digital converters while in the calibration cycle to determine said first and second non-ratiometric offset values, said controller storing said first and second non-ratiometric offset values in said first and second storage registers, respectively;
   said first and second subtraction blocks operable to subtract said stored first and second offset values, respectively, during each processing cycle of said first and second analog-to-digital converters.

12. The converter of claim 7, wherein said first and second analog-to-digital converters are delta-sigma converters.

13. The converter of claim 2, wherein said non-ratiometric offset values are digital values.

14. The converter of claim 13, wherein said subtraction circuit operates in the digital domain.

15. The converter of claim 13 and further comprising:
   a digital-to-analog converter for converting said digital values in said storage device to analog values;
   wherein, said subtraction circuit operates in the analog domain on the input of said analog-to-digital converter.

16. A ratiometric converter with non-ratiometric offset correction, comprising:
   an analog-to-digital converter for receiving an input sense signal having non-ratiometric offsets associated therewith and an input reference voltage having non-ratiometric offsets associated therewith to perform a ratiometric operation thereon and provide a digital output signal proportional to said input sense signal and inversely proportional to said input reference signal;
   a storage device for storing data and non-ratiometric offset values corresponding to the non-ratiometric offsets associated with the input sense signal and input reference voltage;
   a non-ratiometric offset device for determining the non-ratiometric offset values for storage in said storage device; and
   a subtraction circuit for performing a subtraction operation to subtract said stored non-ratiometric offset values during the operation of said analog-to-digital converter prior to the ratiometric operation in said analog-to-digital converter such that offsets resulting from processing of the input sense signal, the input reference voltage and the associated input non-ratiometric offsets are corrected for; and
   said non-ratiometric offset device operable to determine the non-ratiometric offset for each input sense signal processed by said analog-to-digital converter such that said subtraction circuit subtracts the non-ratiometric offset value determined for each input sense signal from the digital domain value thereof.

17. A method for providing non-ratiometric offset correction in a ratiometric converter, comprising the steps of:
   providing an analog-to-converter;
   receiving on the input of the analog-to-digital converter an input sense signal and an input reference signal, the input sense signal having associated therewith input non-ratiometric offsets, and performing a ratiometric operation thereon;
   providing an output signal from the analog-to-digital converter that is proportional to the input sense signal and inversely proportional to the input reference signal in the digital domain;
   providing a storage device;
   storing in the storage device non-ratiometric offset values corresponding to the input non-ratiometric offsets associated with the input sense signal; and
   subtracting the stored non-ratiometric offset values during the operation of the analog-to-digital converter and prior to the ratiometric operation in the analog-to-digital converter such that offsets resulting from processing of the input sense signal with the associated non-ratiometric offsets are corrected for.

18. The method of claim 17, and further comprising correcting for gain errors and ratiometric offsets are correction for non-ratiometric offsets in the output signal from the analog-to-digital converter.

19. The method of claim 17, and further comprising determining the non-ratiometric offset values for storage in the storage device.

20. The method of claim 19, wherein the step of determining the non-ratiometric offset values is operable to determine the non-ratiometric values for each value of the input sense signal processed by the analog-to-digital converter such that the step of performing the subtraction operation is operable to subtract the non-ratiometric offset values determined thereof during operation of the analog-to-digital converter and prior to the ratiometric operation therein.

21. The method of claim 19, wherein the step of determining the non-ratiometric offset values determines the non-ratiometric offset values in a separate calibration operation for storage in the storage device.

22. The method of claim 18, wherein the step of providing the analog-to-digital converter, receiving the input sense signal and the input reference signal and the step of providing the output signal comprises:
   providing a first analog-to-digital converter;
   receiving the input sense signal at the first analog-to-digital converter and converting the input sense signal to a digital sense signal based on an internal reference signal;
   providing a second analog-to-digital converter;
   receiving the input reference signal at the second analog-to-digital converter and converting the received input reference signal to a digital reference signal based on the internal reference signal;
   coupling a divider circuit to the first and second analog-to-digital converters and dividing the digital sense signal by the digital reference signal to provide the output signal; and
   the step of performing the subtraction operation operable in the digital domain to subtract the non-ratiometric offset values stored in the storage device from the digital sense signal prior to input to the divider circuit for the dividing operation.

23. The method of claim 22, wherein the non-ratiometric values stored in the storage device comprise a first non-ratiometric offset value associated with non-ratiometric offsets associated with the input sense signal and further including storing in the storage device a second non-ratiometric offset value associated with non-ratiometric offsets associated with the input reference signal, the step of providing the storage device comprising:
provide a first storage register;
storing in the first storage register the first non-ratiometric offset value;
providing a second storage register;
storing in the second storage register the second non-ratiometric offset storage value;
the step of performing the subtraction operation including:
providing a first subtraction block,
receiving in the first subtraction block the output of the first analog-to-digital converter and the output of the first storage register and subtracting the two values to provide a corrected digital sense signal,
providing a second subtraction block, and
receiving in the second subtraction block the output of the second analog-to-digital converter and the output of the second storage register and subtracting the two values to provide a corrected digital reference signal, the step of dividing operable to divide the corrected digital sense signal by the corrected digital reference signal to provide the output signal.

24. The method of clam 23, wherein the step of determining the non-ratiometric offset values comprises determining the first and second non-ratiometric offset values for each input sense signal value and each input reference signal value, respectively, processed by the respective first and second analog-to-digital converters in a first pass through the first and second analog-to-digital converters and subtracting in a second pass of the input sense signal value and each input reference signal value, respectively, through the first and second analog-to-digital converters the determined first and second non-ratiometric offset values from the output of the first and second analog-to-digital converters, respectively, to provide the corrected digital reference signal and digital sense signal for input to the divider circuit.

25. The method of claim 23, wherein the step of determining the non-ratiometric offset values comprises the steps of:
controlling the input reference signal to provide a first reference voltage during the first pass and to provide a second reference voltage during the second pass; and
controlling the step of performing the subtraction operation to store the output of the first and second analog-to-digital converters during the first pass, and subtracting the stored values from the outputs of the analog-to-digital converters during the second pass to provide the corrected digital reference signal and digital sense signal.

26. The method of claim 23, wherein the step of determining the first and second non-ratiometric offset values comprises the steps of:
controlling the input reference signal to be at a first known calibration reference voltage during a calibration mode and at the input reference voltage signal level during a normal operation mode when not in the calibration mode;
measuring the output of the first and second analog-to-digital converters while in the calibration mode to determine the first and second non-ratiometric offset values, and storing the first and second non-ratiometric offset values in the first and second storage registers, respectively; and
the first and second subtraction blocks operable to perform the respective subtraction operation during each processing cycle of the first and second analog-to-digital converters in the normal operation mode.

27. The method of claim 22, wherein the step of providing the first and second analog-to-digital converters comprises providing first and second delta-sigma analog-to-digital converters.

28. The method of claim 17, wherein the non-ratiometric offset values are digital values.

29. The method of claim 28 and further comprising:
providing a digital-to-analog converter for receiving the digital non-ratiometric offset values and converting the digital non-ratiometric offset values to an analog value; and
the step of performing a subtraction operation operable to subtract the analog output of the digital-to-analog converter from the input of the analog-to-digital converter to remove the non-ratiometric offsets.

* * * * *